US005661482A

United States Patent [19]

Shou et al.

[11] Patent Number: 5,661,482

[45] Date of Patent: Aug. 26, 1997

[54] INTERFACE CIRCUIT HAVING A PLURALITY OF THRESHOLDING CIRCUITS

[75] Inventors: Guoliang Shou; Kazunori Motohashi; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 536,243

[22] Filed: Sep. 29, 1995

[30] Foreign Application Priority Data

Sep. 30, 1994 [JP] Japan .................................. 6-261120

[51] Int. Cl.[6] ........................ H03K 19/0175; H03K 19/00

[52] U.S. Cl. ......................... 341/150; 341/144; 341/172; 326/60

[58] Field of Search .................................. 341/150, 144, 341/155, 110, 163, 172; 326/60

[56] References Cited

U.S. PATENT DOCUMENTS

| | | | |
|---|---|---|---|
| 4,209,852 | 6/1980 | Hyatt | 365/222 |
| 4,604,983 | 8/1986 | Carp et al. . | |
| 4,654,815 | 3/1987 | Marin et al. | 364/606 |
| 4,894,657 | 1/1990 | Hwang et al. . | |
| 5,450,023 | 9/1995 | Yang et al. | 326/60 |

FOREIGN PATENT DOCUMENTS

| | | |
|---|---|---|
| 2469836 | 5/1981 | France . |
| 4-301740 | 10/1992 | Japan . |
| 6-125262 | 5/1994 | Japan . |

OTHER PUBLICATIONS

"Application of Communication Technology to Break Through for Improving Functions of Logic LSI," Design Update, Nikkei Microdevices, Sep., 1994, pp. 100–106.

*Primary Examiner*—Jeffrey A. Gaffin
*Assistant Examiner*—Peguy JeanPierre
*Attorney, Agent, or Firm*—Cushman, Darby & Cushman IP Group of Pillsbury Madison & Sutro LLP

[57] ABSTRACT

An interface circuit comprising a digital to analog converter which comprises a register for receiving and holding each bit of a digital signal, a capacitive coupling for integrating total bits held in the register with weighting, an inverted amplifier circuit for receiving an output of the capacitive coupling and for outputting an analog output voltage, and a feedback capacitance for connecting an outputs of the inverted amplifier circuit to an input of the inverted amplifier circuit, an analog signal line to which the analog output voltage is connected, and an analog to digital converter which comprises a plurality thresholding circuits with stepwise thresholds to which the analog signal line is commonly inputted, each the thresholding circuit receiving outputs of the thresholding circuits of higher threshold with weighting so that the thresholding circuits repeatedly change the outputs from high level to low level or from low level to high level.

4 Claims, 3 Drawing Sheets

INTERFACE CIRCUIT HAVING A PLURALITY OF THRESHOLDING CIRCUITS

FIELD OF THE INVENTION

The present invention relates to an interface circuit, particular to an interface circuit for transmitting an analog signal in a hybrid circuit an analog circuit and a digital circuit.

BACKGROUND OF THE INVENTION

The inventors of the present invention have proposed an interface circuit for converting binary signals to multi-level signals as well as for converting multi-level signals to binary signals in the Japanese patent application Hei 04-301740 and U.S. patent application Ser. No. 08/228,903. This circuit converts a binary signal into a multi-level signal and transmits the result to another device. The multi-level signal is converted by the interface circuit into a binary signal again in the latter device. This circuit has a problem that a divider circuit is used consisting of a plurality resisters serially connected. The circuit consumes a lot of electrical power.

SUMMARY OF THE INVENTION

The present invention is solves the conventional problems and has provides an interface circuit with low power consumption.

An interface circuit according to the present invention integrates digital signals by means of a capacitive coupling so as to convert them into analog signals, while an analog signal is binarized by means of quantizing circuit consisting of a plurality of thresholding circuits. The analog signal is connected to an inverted amplifier, an output of which is connected to its input through a feedback capacitance so that the linearity and stability of the analog output is maintained.

According to the present invention, a voltage driven type analog/digital and digital/analog converters are realized. The electric power consumption is reduced in the voltage driven type, not the current driven type.

PREFERRED EMBODIMENT OF THE PRESENT INVENTION

Hereinafter an embodiment of an interface circuit according to the present invention is described with referring to the attached drawings.

Figure 1:
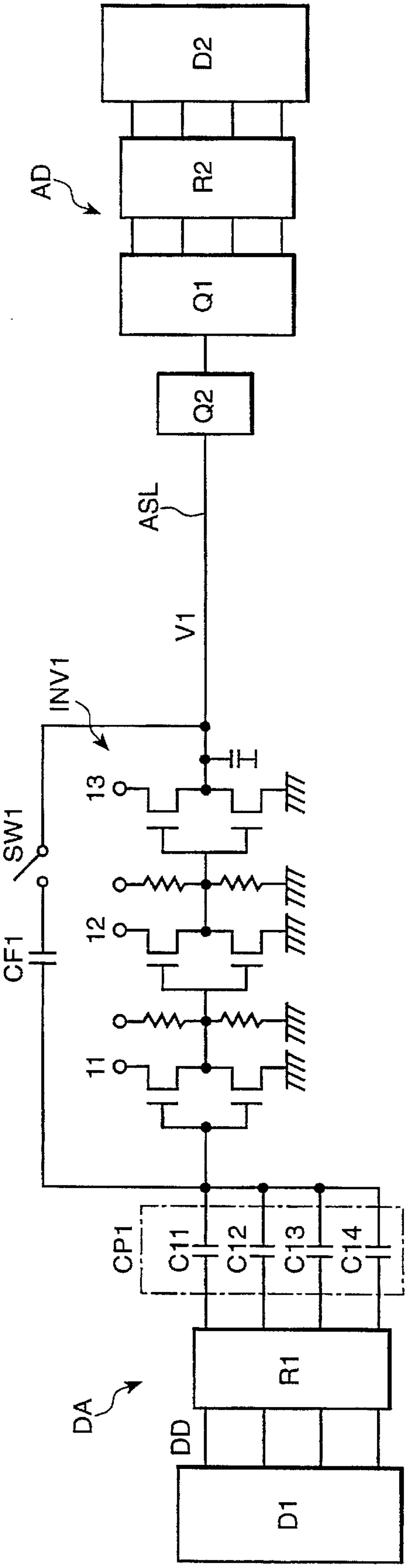
FIG. 1 illustrates first embodiment of an interface circuit according to the present invention.

FIG. 1 shows an interface circuit for converting a binary output DD from a digital device D1 into an analog signal and for transmitting the analog signal to another digital device D2. The circuit has a register R1 for holding an output having a D1. R1 has parallel input and parallel output terminals. A register of serial input and a parallel output, such as shift register, can be used as the register R1. An output of register R1 is input, to a capacitive coupling CP1 and weighted addition is performed. Capacitive coupling CP1 consists of parallel connected capacitances C11, C12, C13 and C14 and performs a weighting of each bit of digital DD by C11, C12, C13 and C14 corresponding to binary weight of each bits. The capacitance ratio set to be C11:C12:C13:C14=8:4:2:1.

An output of capacitive coupling CP1 is input to an inverted amplifier INV1 consisting of 3 stages, i.e., CMOS inverters I1, I2 and I3, and INV1 has a large gain given by a multiplication of open gains of 3 stages inverters. An output of INV1 is connected to its input through a electricity saving switch SW1 and a feed back capacitance Cf1, and an output V1 of INV1 has a value according to the following formula (2) determined by a ratio of CP1 and Cf1 under a condition wherein SW1 is closed.

$$V1 = -\frac{DD}{Cf1} = -\frac{\sum_{i=1}^{4} C1ibiV}{Cf1} \tag{2}$$

Here, Cf1 is defined in formula 3, and V1 is a normalized value.

$$Cf1=C11+C12+C13+C14 \tag{3}$$

The output V1 of the inverted amplifier INV1 in transmitted to device D2 through an analog signal line ASL, and is binarized by a quantizing circuit Q1 on a front stage of D2. The output of the quanitizing circuit Q1 is input to the device D2 after being held in a register R2 similar to the register R1. A voltage driven type D/A converting circuit DA is realized by R1, CP1, INV1 and Cf1.

Figure 2:
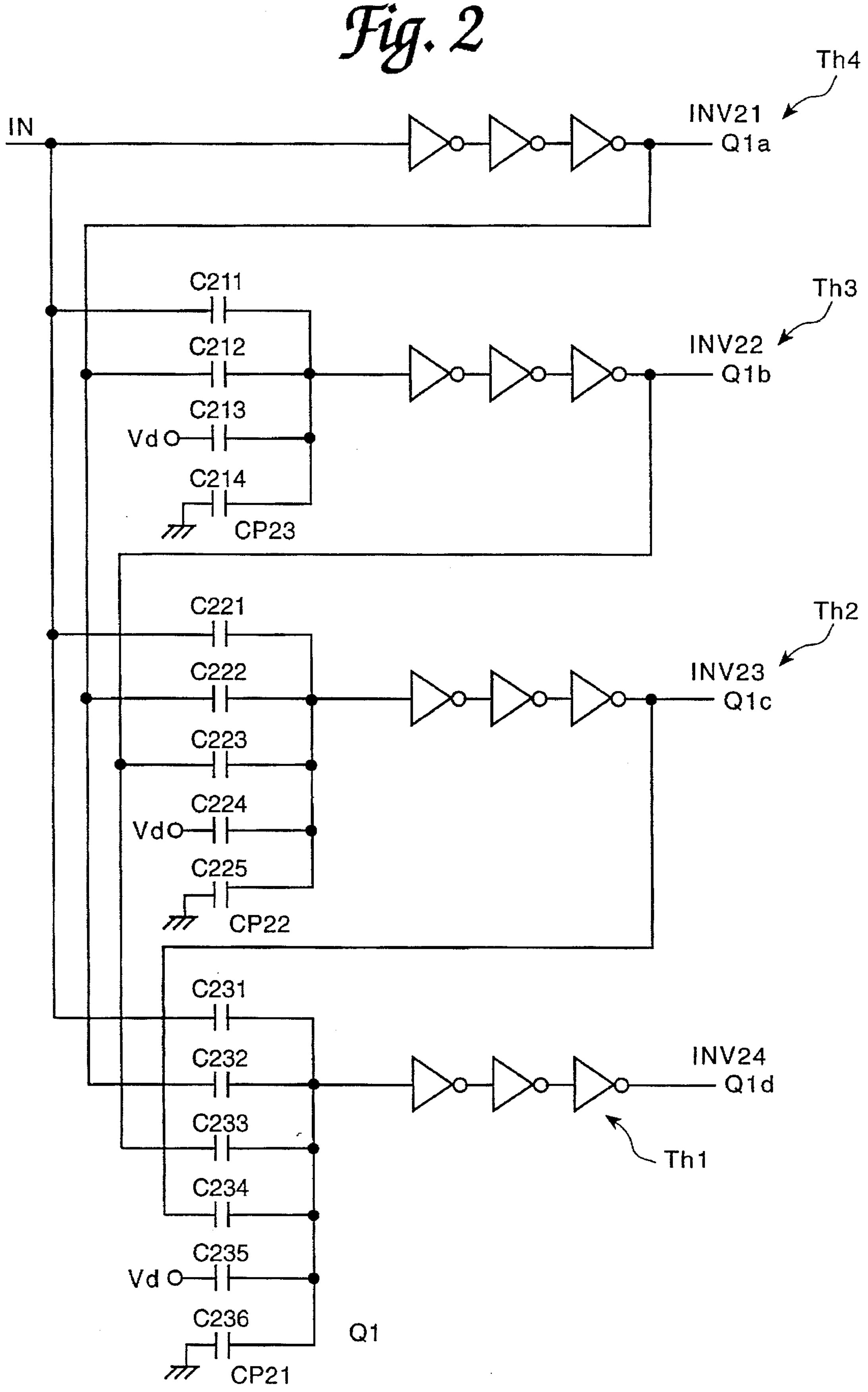
FIG. 2 is a quantizing circuit in FIG. 1.

In FIG. 2, the quantizing circuit Q1 is composed of 4 of thresholding circuits Th1, Th2, Th3 and Th4 from the lowest threshold of the highest threshold, which generate outputs Q1*d*, Q1*c*, Q1*b* and Q1*a*, respectively. The output of each thresholding circuit is input to lower thresholding circuits.

The lowest thresholding circuit Th1 has a capacitive coupling CP21 for receiving V1, Q1*a*, Q1*b* and Q1*c* and inverted amplifier INV24 connected to CP21. The output Q1*d* is generated as an output of inverted amplifier INV24. CP21 is composed of capacitances C231, C232, C233, C234, C235 and C236, to which V1, Q1*a*, Q1*b*, Q1*c*, a the voltage of the electrical source Vd and the ground are connected, respectively. The voltage of the electrical source Vd is input for controlling a threshold of INV24 and the voltage of the ground is input for controlling the total capacitance of CP21.

Thresholding circuit Th2 of the 2nd threshold from the lowest threshold a capacitive coupling CP22 for receiving V1, Q1*a*, Q1*b*, the voltage of the electrical source Vd and the ground and inverted amplifier INV23 connected to CP22. The output Q1*c* is generated as an output of the inverted amplifier INV23. CP22 is composed of capacitances C221, C222, C223, C224 and C225, to which V1, Q1*a*, Q1*b*, the voltage of the electrical source Vd and the ground are connected, respectively. The voltage of the electrical source Vd is input, for controlling the threshold of INV23 and the voltage of the ground is input for controlling the total capacity of CP22.

Thresholding circuit Th3 of the third thresholding circuit from the lowest threshold has capacitive coupling CP23 for receiving Q1*a*, the voltage of the electrical source Vd and the ground and an inverted amplifier INV22 connected to an output of CP23. The output Q1*b* is generated as an output of inverted amplifier INV22. CP23 is composed of capacitances C211, C212, C213 and C214, to which V1, Q1*a*, the voltage of the electrical source and the ground are connected, respectively. The voltage of the electrical source is input for controlling a threshold value of INV22 and the voltage of the ground is input for controlling the total capacity of CP23.

Thresholding circuit Th4 of the highest threshold has an inverted amplifier INV21 for receiving the voltage V1, and the output Q1*a* is generated as an output of INV21.

Table 1 shows capacities of capacitances CP21, CP22 and CP23, and Table 2 shows outputs Q1*a*, Q1*b*, Q1*c* and Q1*d* corresponding to input voltage V1. Cu in Table 1 is a unit capacity as a common unit of capacitances in a LSI, which may be the smallest capacity formed in LSI or rather small capacity easily formed in the LSI. In Table 2, a voltage Va represents a voltage value of (Vd/16).

TABLE 1

| Capacitive Coupling | Capacitance | Capacity |
|---|---|---|
| CP21 | C231 | 16Cu |
| | C232 | 8Cu |
| | C233 | 4Cu |
| | C234 | 2Cu |
| | C235 | Cu |
| | C236 | Cu |
| CP22 | C221 | 8Cu × 2 |
| | C222 | 4Cu × 2 |
| | C223 | 2Cu × 2 |
| | C224 | Cu × 2 |
| | C225 | Cu × 2 |
| CP23 | C221 | 4Cu × 4 |
| | C212 | 2Cu × 4 |
| | C213 | Cu × 4 |
| | C214 | Cu × 4 |

TABLE 2

| Input Voltage | Output Voltage | | | |
|---|---|---|---|---|
| In | Q1d | Q1c | Q1b | Q1a |
| 0 ≦ Vin < Va | Vd | Vd | Vd | Vd |
| Va ≦ Vin < 2Va | 0 | Vd | Vd | Vd |
| 2Va ≦ Vin < 3Va | Vd | 0 | Vd | Vd |
| 3Va ≦ Vin < 4Va | 0 | 0 | Vd | Vd |
| 4Va ≦ Vin < 5Va | Vd | Vd | 0 | Vd |
| 5Va ≦ Vin < 6Va | 0 | Vd | 0 | Vd |
| 6Va ≦ Vin < 7Va | Vd | 0 | 0 | Vd |
| 7Va ≦ Vin < 8Va | 0 | 0 | 0 | Vd |
| 8Va ≦ Vin < 9Va | Vd | Vd | Vd | 0 |
| 9Va ≦ Vin < 10Va | 0 | Vd | Vd | 0 |
| 10Va ≦ Vin < 11Va | Vd | 0 | Vd | 0 |
| 11Va ≦ Vin < 12Va | 0 | 0 | Vd | 0 |
| 12Va ≦ Vin < 13Va | Vd | Vd | 0 | 0 |
| 13Va ≦ Vin < 14Va | 0 | Vd | 0 | 0 |
| 14Va ≦ Vin < 15Va | Vd | 0 | 0 | 0 |
| 15Va ≦ Vin < 16Va | 0 | 0 | 0 | O |

The quantizing circuit generates digital output Q1*a*, Q1*b*, Q1*c* and Q1*d*, this means that a voltage driven type A/D converting circuit AD is realized.

Figure 3:
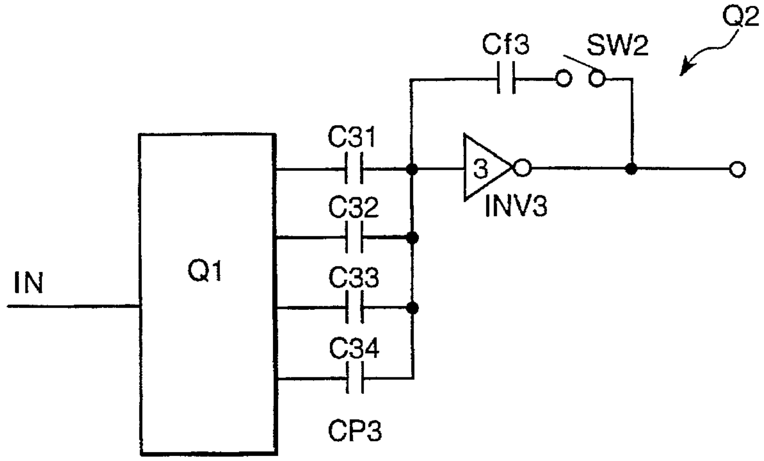
FIG. 3 is a refresh circuit of the same embodiment.

A refresh circuit Q2 is connected between INV1 and Q1, which compensates the linearity and stability of the input of the quantizing circuit Q1. In FIG. 3, the refresh circuit includes a quantizing circuit similar to Q1 and a capacitive coupling CP3 for receiving the outputs of Q1, and a inverted amplifier INV3 connected to an output of CP3. An output of INV3 is connected through a feedback capacitance Cf3 to its input, similar to the circuit of INV1.

The power saving switch (FIG. 1) selectively activate the feedback system of amplifier INV1 invalid so that the nMOS or pMOS of the INV1 is in the cut-off area of their operation area. In the cut-off area, no electrical current occurs through the nMOS or pMOS, so the INV1 does not generate electrical current and the consumed power can be ignored.

Figure 4:
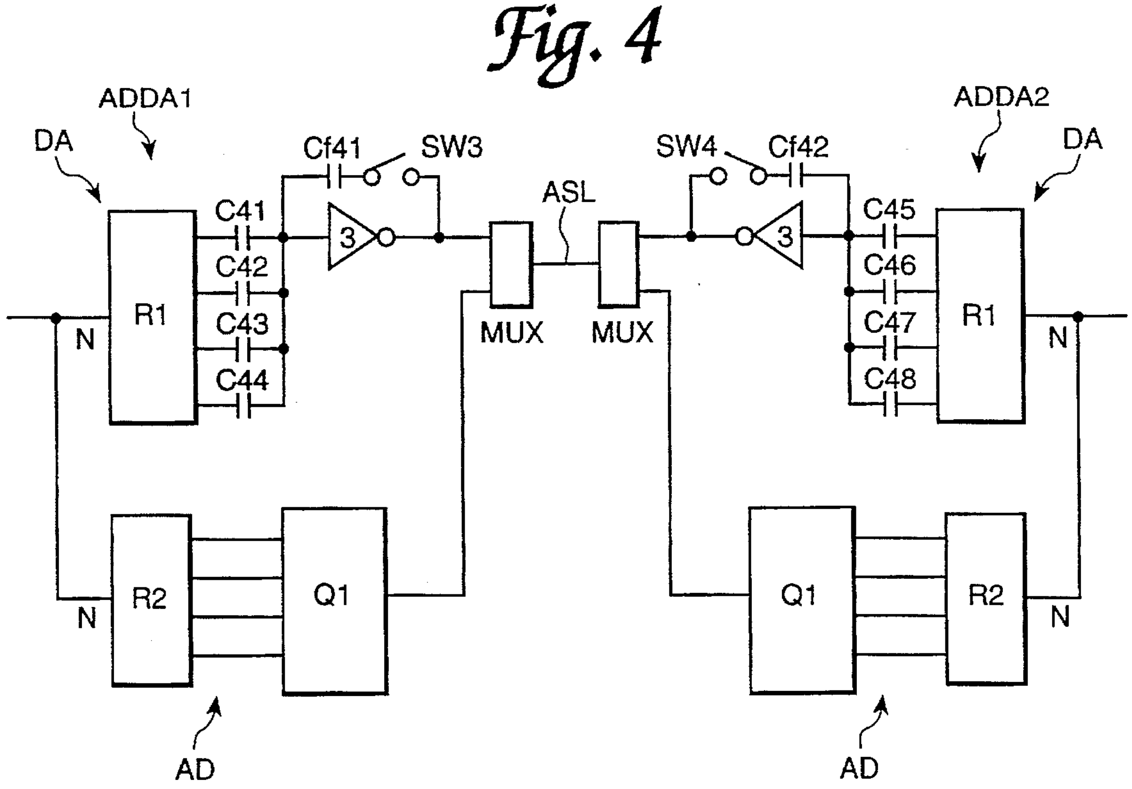
FIG. 4 illustrates a second embodiment of the present invention.

FIG. 4 shows the second embodiment for both A/D and D/A converting. This embodiment includes á pair of combination circuits ADDA1 and ADDA2, each of which is a combination circuit of the above circuits AD and DA. ADDA1 and ADDA2 are connected to opposite ends of the analog signal line ASL, respectively.

Outputs of circuit DA and inputs of circuit AD are connected to a multiplexer MUX for alternatively connecting AD or DA to the ASL. ADDA1 and ADDA2 are connected in reverse, that is, AD of ADDA1 is connected to ASL when DA of ADDA2 is connected to ASL, and DA of ADDA1 is connected to ASL when AD of ADDA2 is connected to ASL. This embodiment enables bi-directional conversion of A/D and D/A.

Figure 5:
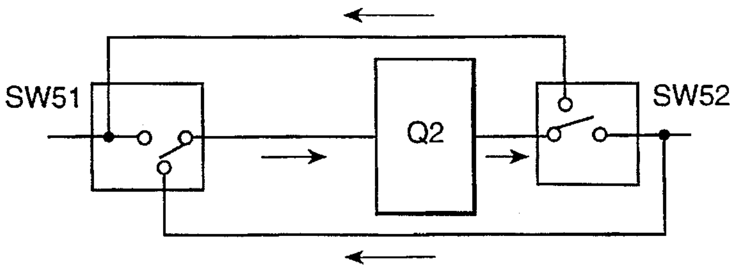
FIG. 5 is a block diagram showing another embodiment of the refresh circuit.

FIG. 5 shows a refresh circuit of bi-directional conversion in which switches SW51 and SW52 are connected to opposite terminals of input and output of the refresh circuit Q2 mentioned above. The switch SW51 selects lines from the left or from the fight in FIG. 5 to be input to Q2, and SW52 selects lines left or right to be input to Q2. SW51 and SW52 are interlocked so that the connections of the input from the left and the output to the right or the input from the right and the output to the left are alternatively settled. This bi-directional refresh circuit expands usages of the interface circuit above.

As mentioned above, an interface circuit according to the present invention integrates digital signals by means of a capacitive coupling so as to convert them into an analog signals, while an analog signal is binarized by means of quantizing circuit consisting of a plurality of thresholding circuits, so that a voltage driven type analog/digital and digital/analog converters are realized and the electric power consumption is saved in the voltage driven type, not the current driven type.

What is claimed is:

1. An interface circuit comprising:

a digital to analog converter which comprises:

a register for receiving and holding a plurality of bits corresponding to bits in a digital signal;

a capacitive coupling for integrating said plurality of bits in said register with weighting applied thereto;

an inverted amplifier circuit receiving an output of said capacitive coupling and outputting an analog output voltage; and a feedback capacitance connecting an output of said inverted amplifier circuit to an input of said inverted amplifier circuit;

an analog signal line to which said analog output voltage is operatively connected; and an analog to digital converter comprising a first plurality of thresholding circuits operatively connected to said analog signal line, wherein a unique threshold is associated with each thresholding circuit in said first plurality of thresholding circuits such that thresholds associated with said first plurality of thresholding circuit vary in a stepwise manner among said first plurality of thresholding circuits, and wherein an output of a thresholding circuit in said first plurality of thresholding circuits having a higher threshold than other thresholding circuits in said first plurality of thresholding circuits is operatively connected to each thresholding circuit in said first plurality of thresholding circuits having a lower threshold with weighting so that said first plurality of thresholding circuits repeatedly change said outputs from one of a high level to a low level and from said low level to said high level.

2. An interface circuit comprising:

a digital to analog converter which comprises:

a register for receiving and holding a plurality of bits corresponding to bits in a digital signal;

a capacitive coupling for integrating said plurality of bits in said register with weighting applied thereto;

an inverted amplifier circuit receiving an output of said capacitive coupling and outputting an analog output voltage; and a feedback capacitance connecting an output of said inverted amplifier circuit to an input of said inverted amplifier circuit;

an analog to digital converter comprising a first plurality of thresholding circuits operatively connected to said analog signal line, wherein a unique threshold is associated with each thresholding circuit in said first plurality of thresholding circuits such that thresholds associated with said first plurality of thresholding circuit vary in a stepwise manner among said first plurality of thresholding circuits, and wherein an output of a thresholding circuit in said first plurality of thresholding circuits having a higher threshold than other thresholding circuits in said first plurality of thresholding circuits is operatively connected to each thresholding circuit in said first plurality of thresholding circuits having a lower threshold with weighting so that said first plurality of thresholding circuits repeatedly change said outputs from one of a high level to a low level and from said low level to said high level;

an analog signal line to which one of an output of said digital to analog converter and an input of said analog to digital converter is alternatively operatively connected; and a switching unit selectively connecting one of said output of said digital to analog converter and said input of said analog to digital converter to said analog signal line.

3. An interface circuit as claimed in claims 1 or 2, further comprising a refresh circuit which comprises:

a direction switching unit disposed so as to switch a signal transmitting direction along said analog signal line;

a second plurality of thresholding circuits operatively connected to said analog signal line, wherein a unique threshold is associated with each thresholding circuit in said second plurality of thresholding circuits such that thresholds associated with said second plurality of thresholding circuit vary in a stepwise manner among said second plurality of thresholding circuits, and wherein an output of a thresholding circuit in said second plurality of thresholding circuits having a higher threshold than other thresholding circuits in said second plurality of thresholding circuits is operatively connected to each thresholding circuit in said second plurality of thresholding circuits having a lower threshold with weighting so that said second plurality of thresholding circuits repeatedly change said outputs from one of a high level to a low level and from said low level to said high level;

a capacitive coupling receiving outputs of said second plurality of thresholding circuits;

an inverted amplifier circuit receiving an output of said capacitive coupling; and a feedback capacitance connecting an output of said inverted amplifier circuit to an input of said inverted amplifier circuit.

4. An interface circuit as claimed in claims 1 or 2, further comprising a power saving switch for opening a circuit connecting said input and output of said inverted amplifier circuit.

* * * * *